(12) United States Patent
Hauschild et al.

(10) Patent No.: US 7,209,214 B2
(45) Date of Patent: Apr. 24, 2007

(54) LITHOGRAPHIC APPARATUS FOCUS TEST METHOD AND SYSTEM, AND DEVICE MANUFACTURING METHOD

(75) Inventors: Jan Hauschild, Eindhoven (NL); Marco Pieters, Eindhoven (NL); Coen Van De Vin, Weert (NL)

(73) Assignee: ASML Netherlands B.V., Veldhoven (NL)

( * ) Notice: Subject to any disclaimer, the term of this patent is extended or adjusted under 35 U.S.C. 154(b) by 301 days.

(21) Appl. No.: 11/017,230

(22) Filed: Dec. 21, 2004

(65) Prior Publication Data
US 2006/0132744 A1  Jun. 22, 2006

(51) Int. Cl.
*G03B 27/32* (2006.01)
*G03B 27/52* (2006.01)

(52) U.S. Cl. .......................... 355/55; 355/77
(58) Field of Classification Search ............. 355/53, 355/55, 61, 77
See application file for complete search history.

(56) References Cited

U.S. PATENT DOCUMENTS

| 6,088,113 | A * | 7/2000 | Kim ...................... 356/401 |
| 2005/0134816 | A1* | 6/2005 | Modderman et al. ......... 355/53 |
| 2006/0103825 | A1* | 5/2006 | Kondo ....................... 355/55 |

* cited by examiner

*Primary Examiner*—Rodney Fuller
(74) *Attorney, Agent, or Firm*—Pillsbury Winthrop Shaw Pittman, LLP

(57) ABSTRACT

A method and system for performing a focus test in a lithographic apparatus. According to the method, a substrate is provided with a layer of radiation sensitive material, the substrate is illuminated in the lithographic apparatus using a first focus sensitive feature and a second focus feature, and the substrate is analyzed to provide results of the focus test using the first focus sensitive feature as imaged on the substrate. The focus test is performed on a regular production wafer, and the results of the focus test are allowed if predetermined statistic properties associated with the second focus feature as imaged on the substrate are within predetermined limits. The second focus feature may be focus sensitive or focus insensitive.

26 Claims, 3 Drawing Sheets

Field

Field

LITHOGRAPHIC APPARATUS FOCUS TEST METHOD AND SYSTEM, AND DEVICE MANUFACTURING METHOD

FIELD OF THE INVENTION

The present invention relates to a lithographic apparatus and a method for manufacturing a device. More specifically, the present invention relates to a method for performing a focus test in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Part of the qualification of a lithographic apparatus relates to the system focus qualification. In existing lithographic apparatus, focus qualification is usually performed on qualification wafers especially prepared for focus qualification, as these allow to provide reproducible test results.

It is, however, also desirable to perform focus test during operational use of the lithographic apparatus, especially on production wafers. Production wafers may have already been exposed to one or more production steps, and as a result already comprise product features. Crosstalk from the focus test system and these features can influence the results of a focus test. In particular, results are obtained from a focus test, but the reliability of the results may be questionable.

SUMMARY

It is desirable to measure the focus performance on real production wafers. However, the features of these layers may interfere with existing focus test measurement techniques, which make the focus test results unreliable. It is thus desirable to have some kind of indicator which provides an indication that a focus test on a regular wafer (with or without processed layers) is reliable or not.

According to an aspect of the invention, there is provided a method for performing a focus test in a lithographic apparatus, including providing a substrate with a layer of radiation sensitive material, illuminating the substrate in the lithographic apparatus using a first focus sensitive feature, which provides a measurable shift in a characteristic of the imaged feature when the feature is defocused, and a second focus feature, and analyzing the substrate to provide results of the focus test using the first focus sensitive feature as imaged on the substrate.

The substrate may be a regular production wafer and the results of the focus test may be allowed if predetermined statistic properties, associated with the second focus feature as imaged on the substrate, are within predetermined limits. In the sense of this application, focus sensitive feature means that a measurable shift in a characteristic of the imaged feature, such as a displacement along the surface of the substrate, results when the feature is defocused.

A regular production wafer is a substrate as used during operational processing of substrates. A regular production wafer may be a flat polished wafer (possibly with resin on top of it), or it may be a substrate which has already passed one or more processing steps and is provided with one or more featured layers. The substrate may be developed after illumination, before the analysis takes place. Alternatively, the analysis may be performed on the latent image on the substrate layer without developing the illuminated substrate. The first focus sensitive feature and second focus feature may be provided on a single test mask, on multiple test masks, or on separate test masks, among other combinations. Also, the first focus sensitive feature and the second focus feature may be provided as a single type of mark on a test mask, in which separate aspects of the single type of mark are used as first focus sensitive feature and second focus feature.

The predetermined statistic properties may include, for example, the standard deviation of the position of the imaged second focus feature on the substrate, in case the second focus feature includes a focus insensitive feature.

In a further aspect, the invention relates to a device manufacturing method that includes transferring a pattern from a patterning device onto a substrate, and performing a focus test by providing a substrate with a layer of radiation sensitive material, illuminating the substrate in the lithographic apparatus using a first focus sensitive feature, which provides a measurable shift in a characteristic of the imaged feature when the feature is defocused, and a second focus feature, and analyzing the substrate to provide results of the focus test using the first focus sensitive feature as imaged on the substrate.

The substrate may be a regular production wafer and the results of the focus test may be used if predetermined statistic properties associated with the second focus feature as imaged on the substrate are within predetermined limits.

In an even further aspect, the invention relates to a lithographic apparatus arranged to transfer a pattern from a patterning device onto a substrate, wherein the lithographic apparatus includes a focus test arrangement which is arranged for providing a substrate with a layer of radiation sensitive material, illuminating the substrate in the lithographic apparatus using a first focus sensitive feature, which provides a measurable shift in a characteristic of the imaged feature when the feature is defocused, and a second focus feature, and analyzing the substrate to provide results of the focus test using the first focus sensitive feature as imaged on the substrate.

The substrate may be a regular production wafer and the results of the focus test may be used if predetermined statistic properties associated with the second focus feature as imaged on the substrate are within predetermined limits.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
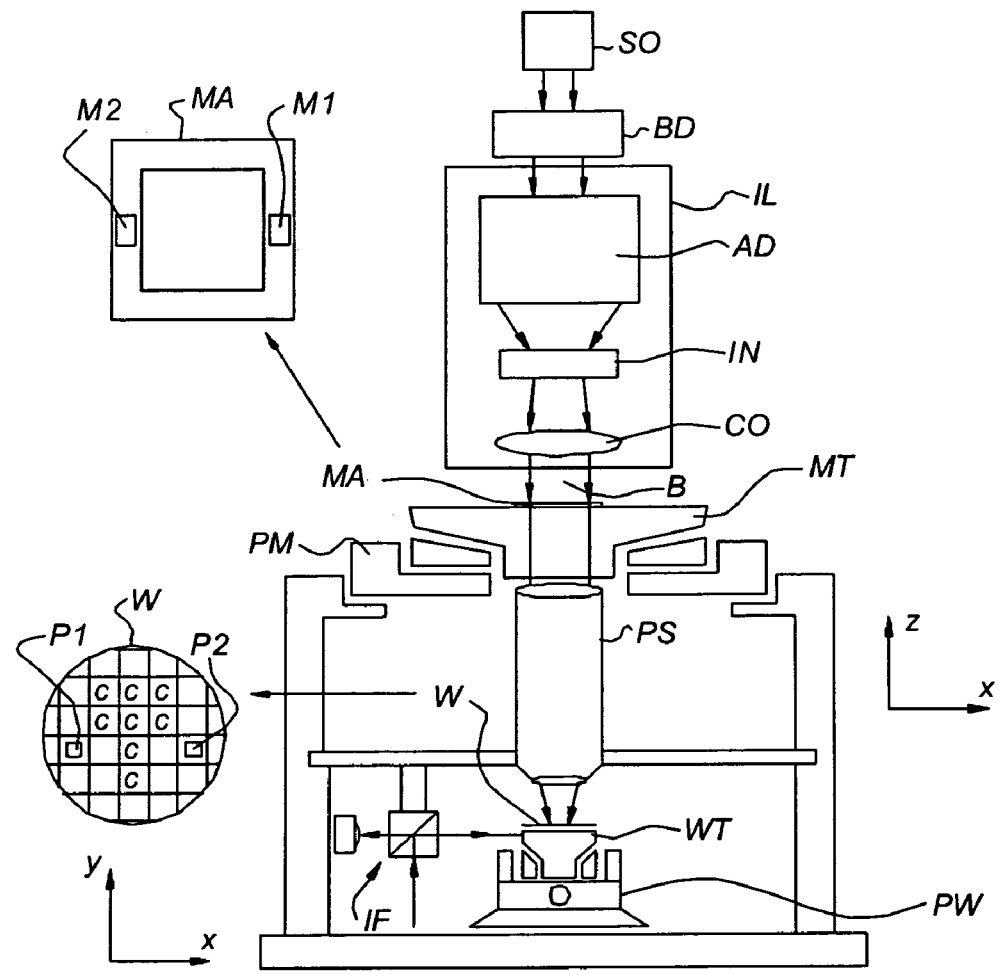
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus also may be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example, when the source is a mercury lamp. The source SO and the illuminator IL, together with the beam delivery system BD, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT then may be shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It is desirable to be able to test the focus characteristics of the lithographic apparatus under operational circumstances, and to determine whether the results of the test are reliable. Normally, these focus tests are performed using specially prepared test wafers, to rule out any unforeseen circumstances. However, for operational use, it is necessary to be able to perform a focus test of a lithographic apparatus using normal production wafers, preferably involving as little non-productive time as possible. This can be done by performing the focus test on the wafer being processed, i.e. on a wafer which has already undergone one or more processing steps in the lithographic apparatus. In conventional focus test methods, focus sensitive marks on a focus test mask are projected on a wafer and, from the resulting exposed and developed (displaced) features on the wafer, measurements are taken. The reliability of the focus test on a regular production wafer may vary, however, and no indicators are present which may be helpful in determining whether or not a focus test that has been executed is reliable.

It has been found that the features already present on a wafer (i.e. the patterned layers on the wafer) may interfere with the measurement reading of the focus test patterns on the wafer (e.g. introducing cross talk effects), and thus result in an unreliable focus test result. However, when the errors due to the wafer features are constant, these errors may be accounted for in determining the focus test results. The marks may be exposed in the resist directly on the product and may be removed after finishing the measurements, without damaging the product itself. The test may be rendered unusable, however, if the crosstalk is not constant per position from field to field. If the crosstalk is determined to be constant per point in the field for a selected number of fields, this may be calibrated, so the wafer and the results of the test may be trusted.

Thus, some kind of indicator may be needed which provides a reliability indication of the focus test performed. In one embodiment of the invention, a focus insensitive mark may be used. The focus incentive mark should fall on exactly the same part of the product within the field for each exposure (field). In other words, the overlay error of the test structures of the focus test and test marks towards the product itself shall be minimal for each exposure (field).

Using a focus test method according to the invention, it is possible to provide a reliable indicator as to whether a focus test performed on a product (wafer with processed layers) can be used or not. This may be helpful in trouble shooting or verification of a lithographic apparatus. Also, it is possible to investigate process dependency of various operational parameters of a lithographic apparatus. Furthermore, it is even possible to use these types of focus tests for automatic process control (APC) of a lithographic apparatus. As the present focus test method can be applied on a regular production wafer with the illuminated and measured focus test being removable without damage to the processed wafer, it is possible for a user of a lithographic apparatus to perform these types of focus tests.

In particular cases, e.g. when determining calibration curves using focus testing, it possible to use the already normally used focus sensitive marks for providing a reliability indicator based on predetermined statistic properties associated with the focus sensitive marks. Calibration curves may be determined by artificially applying focus offsets to predetermined fields during exposure. The focus sensitive marks will be translated into their according lateral shifts by virtue of the artificial offsets. Since the translation should be linear in nature (or at least according to a known function), the predetermined statistic properties for the focus sensitive features may be the residues of calibration, difference of qualification wafer and product wafer calibration curves or fits, estimated sigma of the fit, or the difference of product calibration curves and a predetermined design curve or other statistic properties. The statistic properties used in the present invention may comprise one, two or even more of the mentioned examples of statistic properties.

Figure 2:
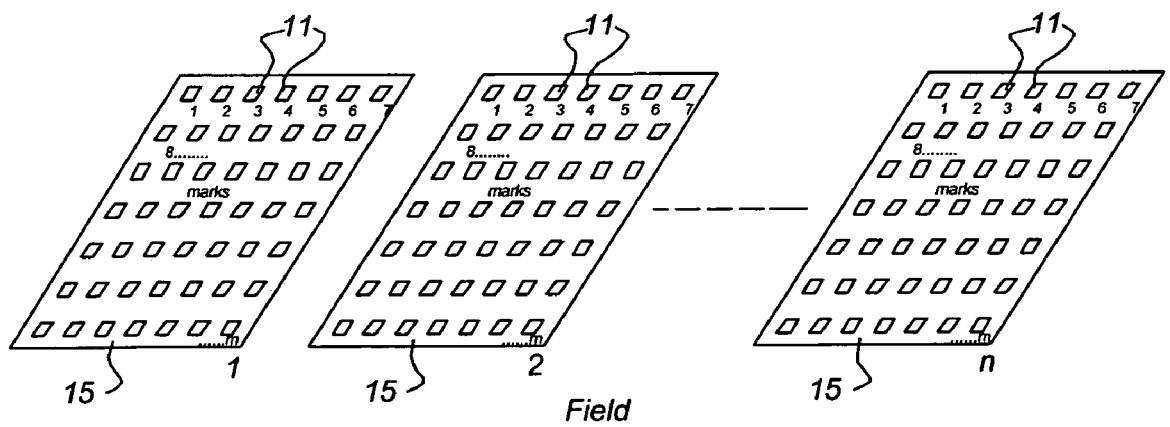
FIG. 2 depicts a schematic view of a series of fields with focus insensitive mark images.

In FIG. 2, a test sequence using a focus test mask having a plurality of m (m=49 shown in FIG. 2) imaged focus insensitive marks 11 is shown. A total of n fields 15 (numbered from 1 to n, $F_j$ with j=1 ... n (e.g. n=9)) on a test wafer are exposed using the same focus test mask. In each field 15, imaged marks 11 may be present (also indicated by $M_{i,j}$ with i=1 ... m, j indicating the associated field 15), and in each field the marks 11 may occupy the same area of a (semi-) product on the wafer. By illuminating each field on the same product (part) on a wafer, the features of a product in the layers under the exposed and illuminated test field 15 should be identical from field to field. Thus, each mark 11 should be influenced in the same manner from field to field.

Figure 3:
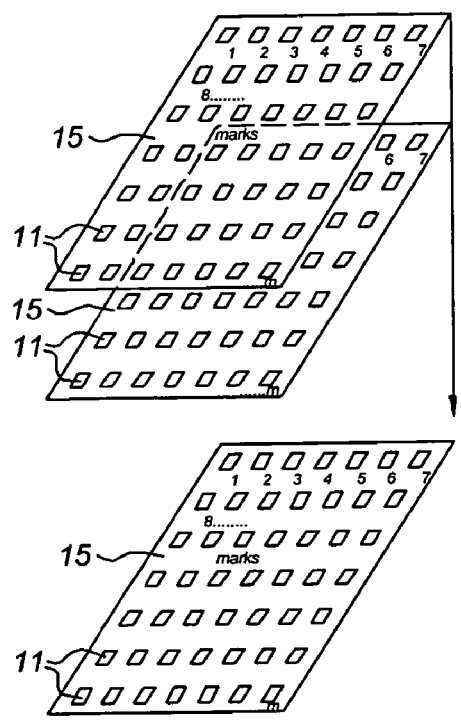
FIG. 3 shows a schematic view of a stacked series of fields for statistic analysis purposes.

Statistical analysis can then be carried out on the stacked fields $F_j$, as shown in FIG. 3, which enables an indicator to show if the crosstalk component by the underlying wafer is constant. By comparing this indicator determined on the processed wafer to the same indicator determined on a qualification wafer, a decisive statement may be drawn regarding the reliability of the test that is used on this exposure for this product wafer.

According to one embodiment of the invention, the following indicator is provided:

Calculating the standard deviation for each mark position over all fields gives:

$$\sigma_i^2 = \frac{\sum_{j=1}^{n}(M_{i,j} - \langle M_i \rangle_j)^2}{n-1},$$

where $$\langle x \rangle_j = \frac{\sum_{j=1}^{n} x_j}{n}$$

indicates the mean value of x.

The standard deviation of the position of each mark may be calculated in two orthogonal directions (e.g. x- and y-direction on wafer surface), or a combination thereof.

Figure 4:
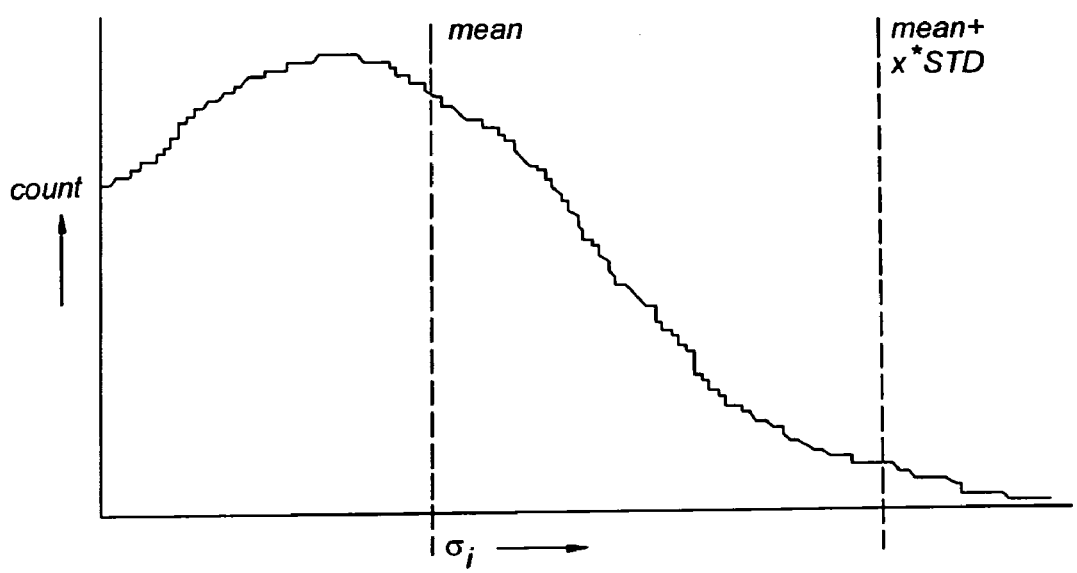
FIG. 4 shows a graph representing a histogram of standard deviation values of an exemplary focus test.

Plotting all the m standard deviation values in one histogram will yield the graph illustrated in FIG. 4. This histogram distribution may be described as the mean of all $\sigma_i$ + a constant (e.g. three) times the standard deviation of all $\sigma_i$.

The distribution of all $\sigma_i$ may be described by a reliability indicator rI as follows:

$$rI = \langle \sigma_i \rangle_i + \text{const.} \cdot \frac{\sum_{i=1}^{m}(\sigma_i - \langle \sigma_i \rangle_i)^2}{m-1}$$

where the constant can be any number>0.

In one example, assume that $rI_{bare}$ shows a value v, and $rI_{product}=10*v$, then the results of the associated focus test may be determined not to be reliable.

Another possible indicator may take into account the standard deviation of identical marks in a series of fields separately (i.e. the single arrow shown in FIG. 3). If one of the marks shows too large a distribution, the focus test result may be regarded as unreliable, at least for the specific area around that mark 11. This may be helpful in interpreting the focus test results, as it allows focus test results to be omitted (using the focus sensitive marks) in an area around the focus insensitive mark showing too high a standard deviation over the fields.

In current lithographic apparatus, a number of different techniques may be used for focus tests. A specific embodiment is now discussed, which shows that the invention may be applied to existing lithographic apparatus without requiring additional (measuring) equipment or procedures.

Figure 5:
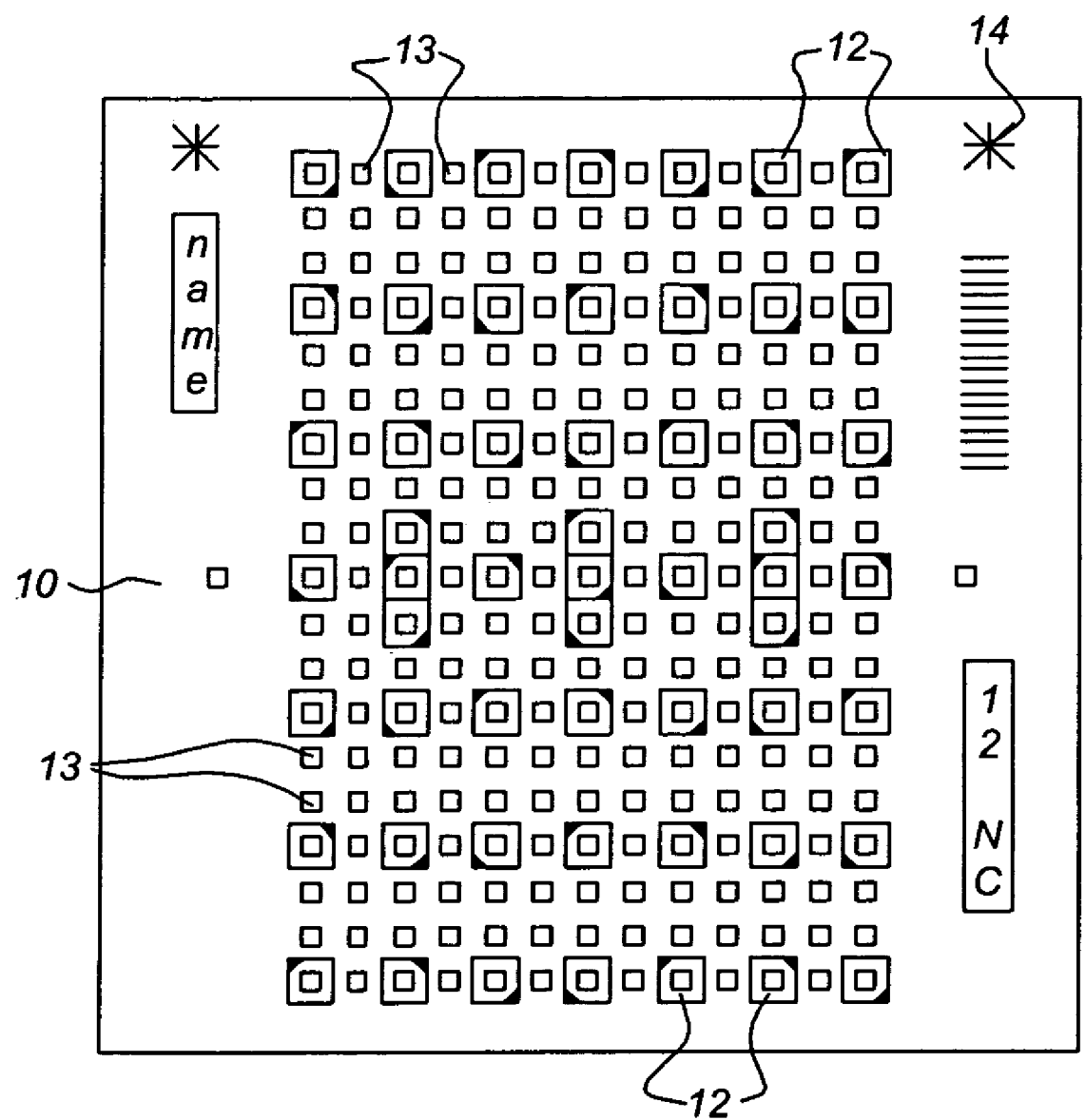
FIG. 5 shows an embodiment of a focus test mask.

Leveling Qualification Test (LQT) is one test that may be regularly applied in existing lithographic apparatus. In one embodiment, the LQT test images a special reticle 10 with wedges 12 glued on top of XPA marks on the wafer, an example of which is shown in FIG. 5. The special test reticle or focus test mask 10 includes a large number of marks 13 in a regular pattern (13×19 marks 13 are in the example shown). The test mask 10 may further include additional alignment marks 14 and additional data in separate areas. A number of marks 13 may be transformed into focus sensitive marks by positioning the wedges 12 on top of them. In FIG. 5, the highest top of each wedge 12 is indicated by a black corner, and by varying the position of this top, the resulting defocus of that mark on the wafer may be in a different (x,y) direction. This results in non-telecentricity of the image and this causes these marks to shift in (x,y) direction, directly proportional to defocus. In one embodiment, the proportionality constant may be found by imaging nine fields in the centre of the wafer, each with a known focus offset, and by fitting the read-out of these nine calibration fields. It should be established that the determined (x,y) shift may be caused only by defocus, not by lens contributions or overlay errors. To that purpose, each focus mark may be surrounded by several reference marks 13 which do not have wedges 12 at reticle level. These reference marks 13 thus may be insensitive to focus and serve only for removing the intrafield (x,y) fingerprint and overlay errors from the focus results. The intrafield fingerprint may be determined by taking and correcting for the mean (x,y) shift per mark, averaged over the nine calibration fields. After this correction, and for an LQT test on qualification wafers, the vectors of the reference marks may be random in direction and small in length (i.e. a few nm).

The effect of imaging these marks 13 on top of a product (i.e. an IC) may cause the intrafield correction to differ significantly from that on a qualification wafer. This may be the influence of the product on the read-out system via the marks 13. If this product influence per mark 13 is determined to be identical (same direction and magnitude of the vector of the reference mark) on every field on the wafer, this may indicate that it may be corrected for simply by correcting with a constant. If this is the case, the focus test on product may be declared successful, since the product disturbance may be calibrated away.

If, however, the product influence on a mark differs significantly per field, no successful correction may be applied.

In order to find an indicator for the reliability of an LQT test, the standard deviation of the position of a reference mark (i) should be calculated over the nine calibration fields. This value is called $\sigma_i$. For a layout with N reference marks per field, the statistics of all $\sigma_i$'s over all N marks yield $<\sigma_i>_{field}$ and $\sigma(\sigma_i)_{field}$. The determined reliability indicator is now equal to $(<\sigma_i>_{field}+3*\sigma(\sigma_i)_{field})$. This analysis may be performed for both directions X and Y.

In the embodiment shown above in relation to FIG. 5 above, the focus test mask 10 may include both focus sensitive features and focus insensitive features, of which the focus sensitive features (marks 13 plus wedge 12) may be used for determining the focus test results, and the focus insensitive features (marks 13 without wedge 12) may be used for predicting the reliability of the focus test results. Thus, the focus test mask 10 used may provide for both features.

In another embodiment of the invention, the focus test methods, in a lithographic apparatus using phase masks, the focus test mask may include a plurality of identical focus test marks or phase shift marks, such as box-in-box like structures. Various techniques may be used such as a Phase Shift Focus Monitor test and a Phase shift Grating Focus Monitor. In these techniques, no reference marks may be used that might be used as focus insensitive feature on the focus test mask. However, as a result of overlay errors and/or lens contributions, the box-in-box like structures may shift as a whole. Thus, in this case, the (x,y) displacement of the entire box-in-box structure may be determined (using the existing focus test measurements), and statistics related to these displacements over a number of fields may be used for determining a reliability indicator, analogous to the method embodiments described above for LQT focus test.

Another exemplary embodiment includes taking a second reticle with the same marks at the same position as on the test reticle, but being focus independent. Expose the second reticle, read it out, and use the reliability indicator to tell if the results are influenced or not. If not, clean the wafer, place resist on it again and expose the real test mask in order to measure the focus characteristics.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of performing a focus test in a lithographic apparatus under operational conditions, comprising:
   providing a substrate with a layer of radiation sensitive material;
   illuminating the substrate in the lithographic apparatus using a first focus sensitive feature, which provides a measurable shift in a characteristic of the imaged feature when the feature is defocused;
   illuminating the substrate using a second focus feature;
   analyzing the substrate to determine results of the focus test based on the first focus sensitive feature as imaged on the substrate; and
   determining a reliability of the focus test based on whether or not predetermined statistic properties associated with the second focus feature as imaged on the substrate are within predetermined limits.

2. The method of claim 1, further comprising illuminating a plurality of fields on the substrate, wherein corresponding fields on the substrate are provided on a same position on a product produced on the substrate.

3. The method of claim 1, wherein the predetermined limits comprise a maximum value for a reliability indicator, which is determined using a constant value that is multiplied by a reliability indicator that is measured for a qualification wafer on the lithographic apparatus.

4. The method of claim 1, wherein the second focus feature comprises a focus insensitive feature.

5. The method of claim 4, wherein the first focus sensitive feature comprises a plurality of focus sensitive marks and the focus insensitive feature comprises a plurality of focus insensitive marks.

6. The method of claim 4, wherein the first focus sensitive feature is provided on a mask, wherein the first focus sensitive feature comprises one or more phase shift marks and the focus insensitive feature corresponds to the one or more phase shift marks as a whole.

7. The method of claim 2, wherein the focus insensitive feature comprises a plurality of focus insensitive marks and the predetermined statistic properties include a standard deviation for each of the plurality of focus insensitive marks over all fields.

8. The method of claim 2, wherein the second focus feature comprises a focus insensitive feature that includes a plurality of focus insensitive marks and the predetermined statistic properties comprise a reliability indicator calculated over an entire field from a standard deviation for each of the plurality of focus insensitive marks.

9. The method of claim 1, wherein the substrate is a production wafer.

10. A device manufacturing method comprising transferring a pattern from a patterning device onto a substrate and performing a focus test under operational conditions, comprising:
providing a substrate with a layer of radiation sensitive material;
illuminating the substrate using a first focus sensitive feature, which provides a measurable shift in a characteristic of the imaged feature when the feature is defocused;
illuminating the substrate using a second focus feature;
analyzing the substrate to determine results of the focus test based on the first focus sensitive feature as imaged on the substrate; and
determining a reliability of the focus test based on whether or not predetermined statistic properties associated with the second focus feature as imaged on the substrate are within predetermined limits.

11. The method of claim 10, further comprising illuminating a plurality of fields on the substrate, wherein corresponding fields on the substrate are provided on a same position on a product produced on the substrate.

12. The method of claim 10, wherein the predetermined limits comprise a maximum value for a reliability indicator, which is determined using a constant value that is multiplied by a reliability indicator that is measured for a qualification wafer on a lithographic apparatus that performs the focus test.

13. The method of claim 10, wherein the second focus feature comprises a focus insensitive feature.

14. The method of claim 13, wherein the first focus sensitive feature comprises a plurality of focus sensitive marks and the focus insensitive feature comprises a plurality of focus insensitive marks.

15. The method of claim 13, wherein the first focus sensitive feature is provided on a mask, there in the first focus sensitive feature comprises one or more phase shift marks and the focus insensitive feature corresponds to the one or more phase shift marks as a whole.

16. The method of claim 11, wherein the focus insensitive feature comprises a plurality of focus insensitive marks and the predetermined statistic properties include a standard deviation for each of the plurality of focus insensitive marks over all fields.

17. The method of claim 11, wherein the second focus feature comprises a focus insensitive feature that includes a plurality of focus insensitive marks and the predetermined statistic properties comprise a reliability indicator calculated over an entire field from a standard deviation for each of the plurality of focus insensitive marks.

18. The method of claim 10, wherein the substrate is a production wafer.

19. A lithographic apparatus arranged to transfer a pattern from a patterning device onto a substrate having a layer of radiation sensitive material thereon, wherein the lithographic apparatus includes a focus test arrangement that conducts a focus test under operational conditions, the focus test arrangement comprising:
an illuminator that illuminates the substrate in the lithographic apparatus using a first focus sensitive feature, which provides a measurable shift in a characteristic of the imaged feature when the feature is defocused, and a second focus feature;
an analyzer that analyzes the substrate to determine results of the focus test based on the first focus sensitive feature as imaged on the substrate; and
a reliability determination device that determines reliability of the focus test based on whether or not predetermined statistic properties associated with the second focus feature as imaged on the substrate are within predetermined limits.

20. The focus test arrangement of claim 19, wherein the substrate includes a plurality of fields and the illuminator illuminates the plurality of fields on the substrate, and wherein corresponding fields are provided on a same position on a product produced on the substrate.

21. The focus test arrangement of claim 19, wherein the predetermined limits comprise a maximum value for a reliability indicator, which is determined using a constant value that is multiplied by a reliability indicator that is measured for a qualification wafer on the lithographic apparatus.

22. The focus test arrangement of claim 19, wherein the second focus feature comprises a focus insensitive feature.

23. The focus test arrangement of claim 22, wherein the first focus sensitive feature comprises a plurality of focus sensitive marks and the focus insensitive feature comprises a plurality of focus insensitive marks.

24. The focus test arrangement of claim 22, further comprising a mask that includes the first focus sensitive feature, wherein the first focus feature comprises one or more phase shift marks and the focus insensitive feature corresponds to the one or more phase shift marks as a whole.

25. The focus test arrangement of claim 20, wherein the second focus feature comprises a focus insensitive feature, and wherein the focus insensitive feature comprises a plurality of focus insensitive marks and the predetermined statistic properties include a standard deviation for each of the plurality of focus insensitive marks over all fields.

26. The focus test arrangement of claim 20, wherein the second focus feature comprises a focus insensitive feature, and wherein the focus insensitive feature comprises a plurality of focus insensitive marks and the predetermined statistic properties comprise a reliability indicator calculated over an entire field from the standard deviation for each of the plurality of focus insensitive marks.

* * * * *